Figure 1:
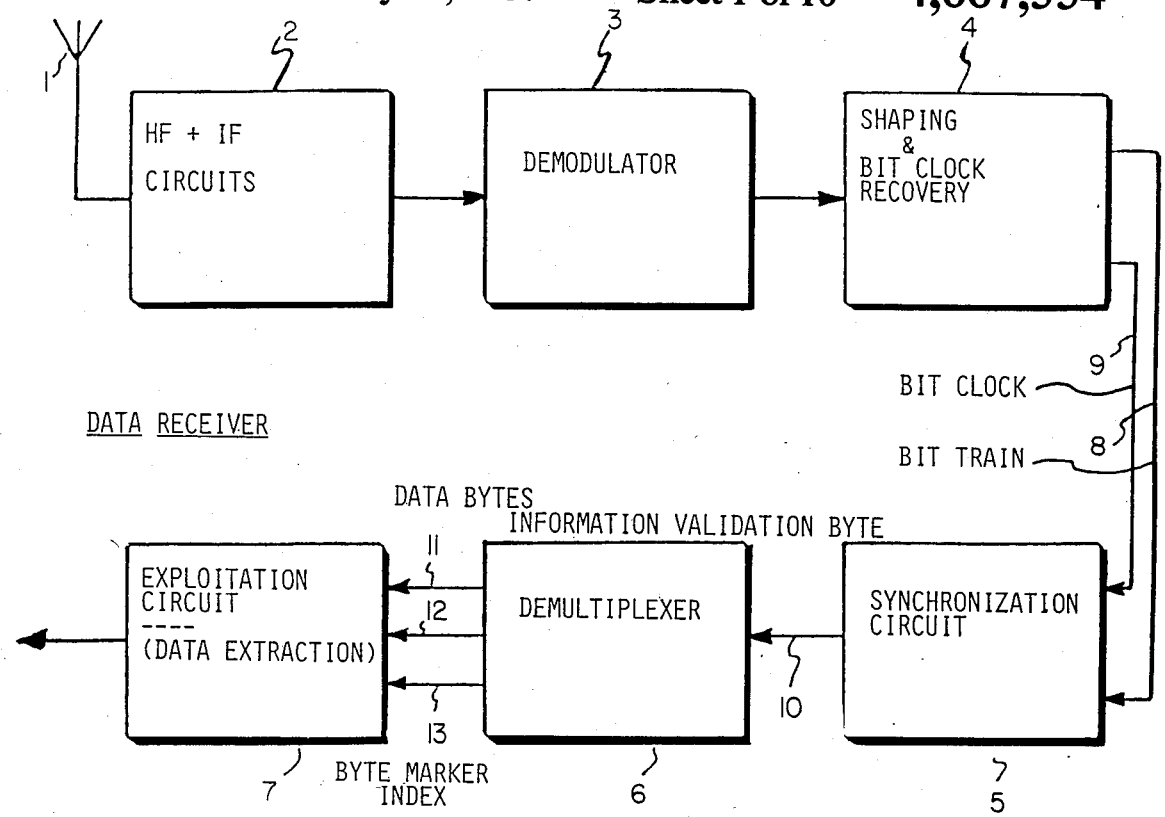

United States Patent [19]

Collec et al.

[11] Patent Number: 4,667,334
[45] Date of Patent: May 19, 1987

[54] SYSTEM FOR BROADCASTING DATA PACKETS ORIGINATING FROM DIFFERENT SOURCES

[75] Inventors: Jean P. Collec, Rennes; Michel R. Rigal, Janze, both of France

[73] Assignee: Etablissement Public de Diffusion Dit "Telediffusion de France", France

[21] Appl. No.: 700,755

[22] Filed: Feb. 12, 1985

[30] Foreign Application Priority Data

Feb. 15, 1984 [FR] France ................................ 8402623

[51] Int. Cl.$^4$ .............................................. H04L 7/00
[52] U.S. Cl. .................................... 375/116; 375/114; 371/42
[58] Field of Search ............... 375/116, 111, 114, 120; 371/47, 37, 38, 40, 42, 46

[56] References Cited

U.S. PATENT DOCUMENTS 3,766,315 10/1973 Couvillon, Jr. et al. ........... 375/114
4,554,540 11/1985 Mori et al. ......................... 375/116

Primary Examiner—Benedict V. Safourek
Assistant Examiner—M. Huseman
Attorney, Agent, or Firm—Laff, Whitesel, Conte & Saret

[57] ABSTRACT

A radio system broadcasts binary data packets that can be received in mobile receivers. The initial parts of the packets are transmitted periodically. The prefix of each packet includes synchronizing information. The synchronization processing includes seeking a phase and a tracking phase. The transition from the seeking to the tracking phases occurs when the synchronization pattern has been received two consecutive times with a null Hamming distance.

15 Claims, 16 Drawing Figures

LOGIC OF DATA MODULE

INTERFACE BETWEEN INPUT AND LOGIC

INTERFACE BETWEEN OUTPUT AND LOGIC

DEMODULATOR

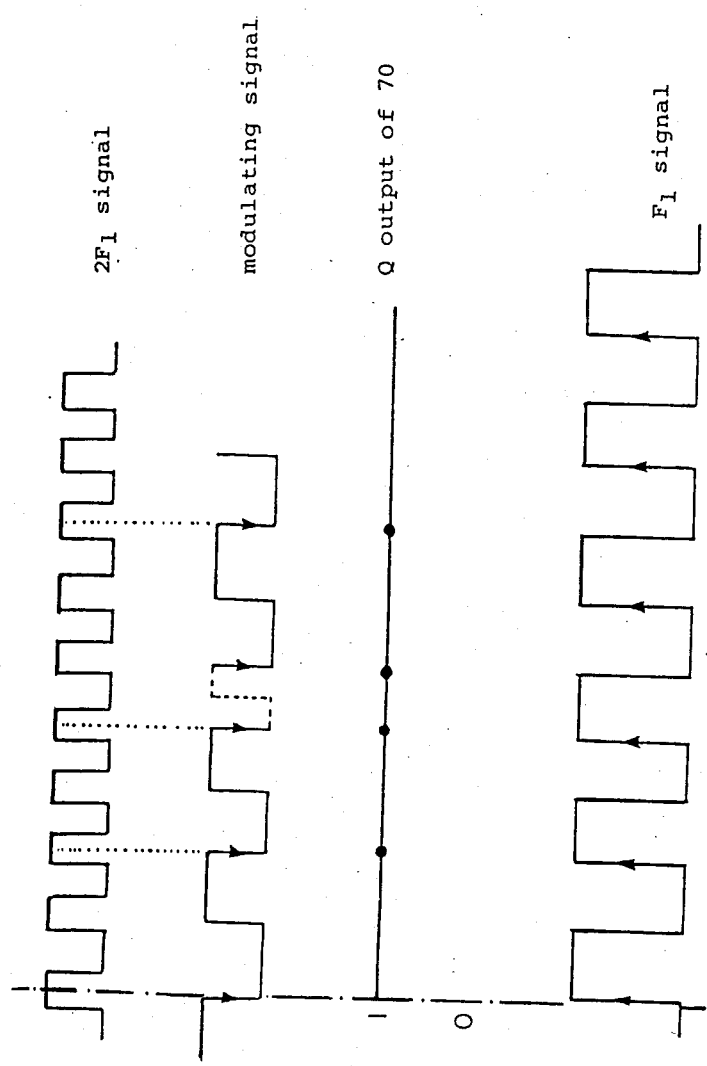
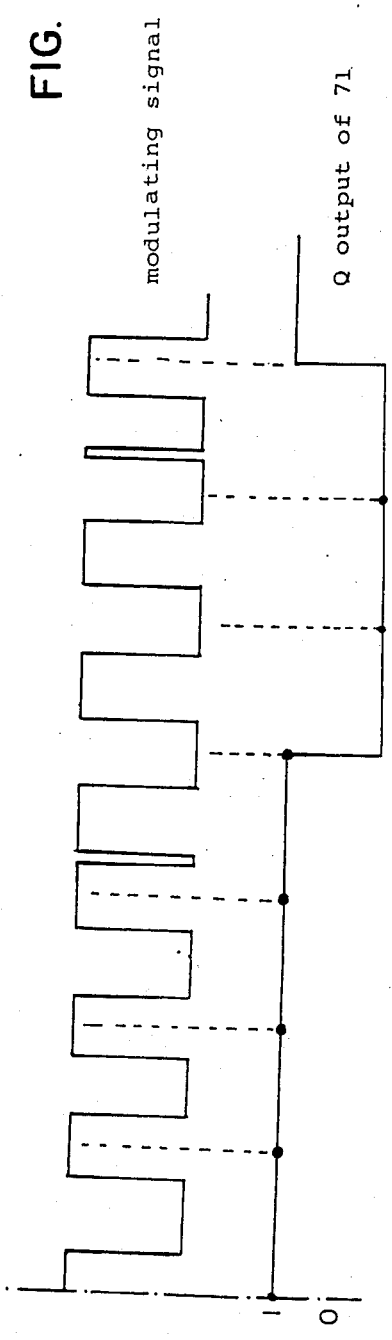
FIG. 14a
FIG. 14b

SYSTEM FOR BROADCASTING DATA PACKETS ORIGINATING FROM DIFFERENT SOURCES

The present invention concerns a system for broadcasting data packets originating from different sources and especially destined to be received in mobile receivers, generally installed in vehicles. Of course, the broadcasted data can also be received in fixed receivers.

The reception of data in a mobile receiver presents specific problems. In fact, because of the motion of the vehicle, the receiving conditions change continuously, as does the interference which is prone to affect the received signal.

Furthermore, the receiving antenna, placed on the vehicle, is at a height of 1.5 meters. For obvious reasons, it is practically impossible to use a directional receiving antenna.

Finally, when the mobile unit containing the receiver moves in a largely urbanized area, the numerous reflections of signals from neighboring buildings create a composite received signal, which can be very complex. More specifically, when there are a large number of reflections, the envelope of the received composite electric field follows a Rayleigh probability density function.

Practically, this means that the field received during the motion of the vehicle, that is the signal at the input to the mobile receiver, will have a value that can change rapidly. In particular, it is possible to observe rapid signal fades which are on the average spaced by a distance corresponding to the half wavelength of the carrier frequency used. The impact of these fades depends on the data rate and the speed of the vehicle. The depth of these fades also varies but is commonly between 10 and 20 dB below the mean received level.

Finally, there exists another category of disturbances which are parasitic in nature, in particular, those originating from human activities. The importance of this interference varies according to the frequency band used. The more important sources of these parasitic disturbances are motor vehicle ignition systems, certain industrial installations that used high frequency currents and defective insulators in medium to high voltage distribution networks.

All these interferences add up to degrade the received signal quality and since the information is made up of digital data this results in an increased received bit error rate. In practice, experiments on received broadcast data in mobile units have shown that the error rate is subject to rapid and sometimes considerable fluctuations around an average value determined over a long period of time relative to the bit rate (of the order of many minutes). These variations are effectively due not only to variations in the received signal level but also due to parasitic electrical interference.

An in depth analysis shows the existence of error bursts corresponding to localized and substantially increased error rates. These bursts which can sometimes contain thousands of consecutively incorrect bytes, that is one having at least one error. These errors push one to provide, a particularly efficient error detection system and to proceed to packet repetition. In fact, in the above mentioned conditions, the use of a correction strategy to increase the reliability of broadcast messages would lead to the use of codes with extensive error correcting capability. However, these codes generally require complex decoding which would increase the cost of the receiver.

In practice, the design of a reliable data packet broadcast system leads to making choices among known techniques, then to improve certain aspects of these techniques to better adapt them to the desired results. These choices regard namely the frequency band used, the modulation, the data rate, the start of packet detection scheme, the coding used for error detection and the packet repetition strategy. In practice some of these choices are linked to one another. It is also necessary to keep track of the fact that the broadcast system must be able to broadcast data packets originating from different sources, namely that it is a multiservice system, capable of processing alphanumeric text as well as graphic data or synthetic voice.

With regards to the frequency bands, we must take into consideration the congestion in the spectrum along with the national and international legal constraints. In the example to be described below the HF carrier frequency which is used is at 67.75 MHz.

The choice of modulation is the result of a compromise among different parameters, the performance of the modulation with respect to the noise, its efficiency (that is the bit rate which it allows in a given spectrum), its resistance to linear and nonlinear distortions and, finally, the complexity of the demodulator which determines its cost. The simplified MSK type modulation, for example that described in Pat. No. FR-A-2 428 345, fulfills this compromise. It is a biphase modulation with attenuated sidebands. With respect to noise, the theoretical performances of this modulation are the same as those of coherently detected two and four phase modulations. It is a constant envelope modulation which offers good resistance to distortions. Its use leads to a demodulator having the same structure and complexity as a BPSK demodulator.

In the example to be described, a bit rate of 30 kbit/s is used thus allowing complete processing with software. One could provide higher bit rates by using wired program circuits.

With regard to detecting the starts of packets, it is advantageous to have the packet starts periodic to obtain some kind of system synchronization.

In Pat. No. EP-A-0 044 780 the description of a multiplexing system for digital data packets transmitted on a continuous wave carrier such as, for example, a carrier broadcast by satellite or a terrestrial network is given. In this system, the data packets (Bi) are individually included in data transmission blocks (Pi) which are periodically transmitted on a digitally modulated carrier. If we consider the clock of the transmitted digital data, the transmission period of the transmission blocks (Pi) is equal to "I" clock pulses. The repetition period of the starts of packets is equal to or slightly larger than the maximum length of a transmission block. The start of each transmission block comprises a synchronization sequence (Ei).

However, as is clearly mentioned in the text of Pat. No. EP-A-0 044 780, the system is destined in particular for large capacity satellite or terrestrial networks offering links of excellent quality. In practice, such broadcasted signals have levels which vary much more slowly than the signals received by mobile receivers. The synchronization circuits shown in FIGS. 5 and 9–10 of Pat. No. EP-A-0 044 780 are satisfactory for satellite broadcasting. Thus, the graph of FIG. 10 illustrates that synchronization is maintained during twelve consecutive periods in spite of not recognizing the synchronization sequence and that only three successive recognitions are sufficient for the system to lock up.

With, for example, data packets of forty or so bytes, and the bit rate of 30 kbit/s mentioned above, the synchronization circuit of Pat. No. EP-A-0 044 780 loses lock only after about 130 ms and requires 40 ms to relock itself. However, in mobile receivers, the signal level can fade and return in much shorter times. The known circuit would track for too long packets with probable errors and would unduly delay the restart of processing. This is why one object of the present invention consists in providing a synchronization scheme that allows a better tracking of the variations in level of the signal entering the mobile receiver.

Given, as mentioned above, that we have provided repetition of the packets many times, it has also appeared interesting to use a data grouping system such as that described in patent application No. EP-A-0 077 712. In this grouping scheme, the data transmitted by each source are arranged in data groups, each group being made up of a sequence of data blocks. Each data block forms the data field of one packet. In other words, each packet is made up of a block of data preceded by a prefix which contains bit and byte synchronization signals, a source identification code, a packet continuity indicator signal and packet structure information. Furthermore, the first block of the group has a group header made up of bytes defining the group type, the group continuity index, the number of blocks in the group following the first block and the size of the last block in the group, all blocks except the last one being of maximum size. The packet prefix comprises among other things information indicating if the block in the packet being considered is the first block in a group or not.

Furthermore, the header in the first block of a group comprises information indicating the number of times that the group is yet to be repeated.

each data block ends with a suffix of block data control bytes.

In accordance with a characteristic of the invention, a broadcasting system for binary data packets is capable of being received by mobile receivers. The starts of packets are periodically transmitted, the prefix of each packet beginning with two bit synchronization bytes and one byte synchronization byte. The second bit synchronization byte and the byte synchronization byte make up a periodic start of packet synchronization pattern, in which the processing of synchronization comprises a seeking phase and tracking phase. The transition forming the seeking phase to the tracking phase is carried out when, in the seeking phase, the synchronization pattern has been found two consecutive times with a null Hamming distance. The seeking phase has two states, the transition from the first to the second being carried out when a synchronization pattern has been found with a null Hamming distance, the transition from the second to the first being carried out when the next pattern is not found with a null Hamming distance. The tracking phase also has two states, the first being the state taken after the transition from the seeking phase to the tracking phase. The transition from the first to the second occurs when the next pattern is found with a Hamming distance greater than 1, the transition from the second to the first being carried out when the next pattern is found with a null or equal to 1 Hamming distance. The transition from the tracking phase to the seeking phase is done when, in the second state of the tracking phase, the next pattern is found with a Hamming distance larger than 1.

In accordance with another characteristic of the invention, the modulation used in the system is a two state modulation with attenuated sidebands. In the seeking phase, the detection of the synchronization pattern is also carried out on its complement, the seeking and tracking states being paired into two directly complemented states. In the first seeking state the recognition of the straight pattern inhibits the complemented states and vice versa.

In accordance with another characteristic, within the system, the binary data originating from one source are assembled into groups which are segmented to form a sequence of data blocks, each block being completed by a control suffix constituting the data field of one packet. The transmission of each group is repeated a number of times and the groups being reconstructed at the receiver as the groups are repeated. Then, the groups are arranged into a page as soon as a complete error free group has been received.

In accordance with another characteristic, within the system, a first automatic gain control is provided in the HF stage. A second automatic gain control is provided in the IF stage, with the time constant of the first automatic gain control slightly shorter than that of the second automatic gain control.

In accordance with another characteristic, within the system, the binary data are transmitted using MSK modulation or the like. At the receiver, the modulated signal is hard limited, then phase compared with a frequency selectable rectangular reference signal set at twice the carrier frequency of the modulated signal. The phase difference which is measured at the comparison is used to set the frequency of the reference signal. The frequency of the reference signal is divided by two to supply a signal which is mixed with the modulated signal to produce the demodulated signal.

Figure 4:
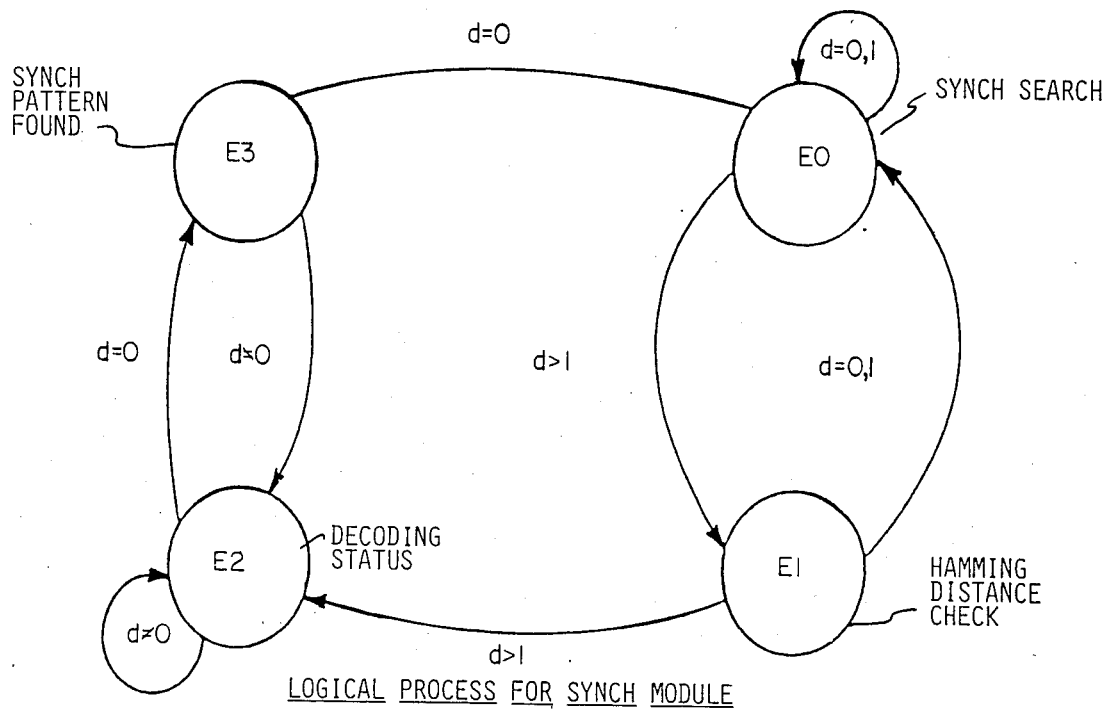
Figure 2A:
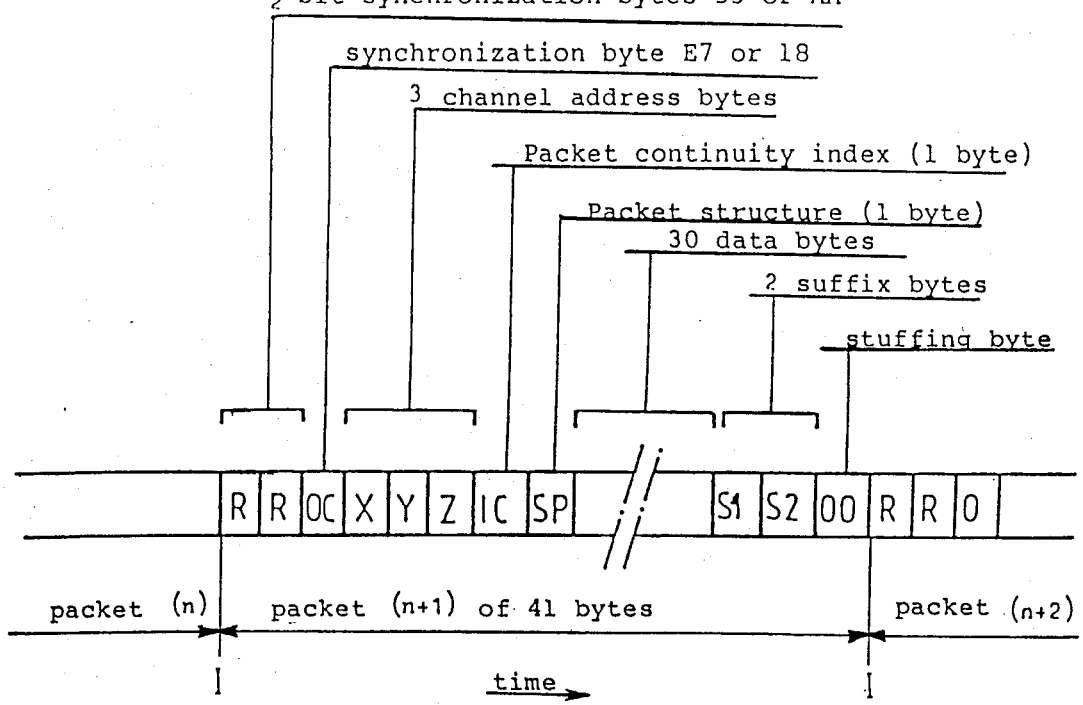
Figure 2B:
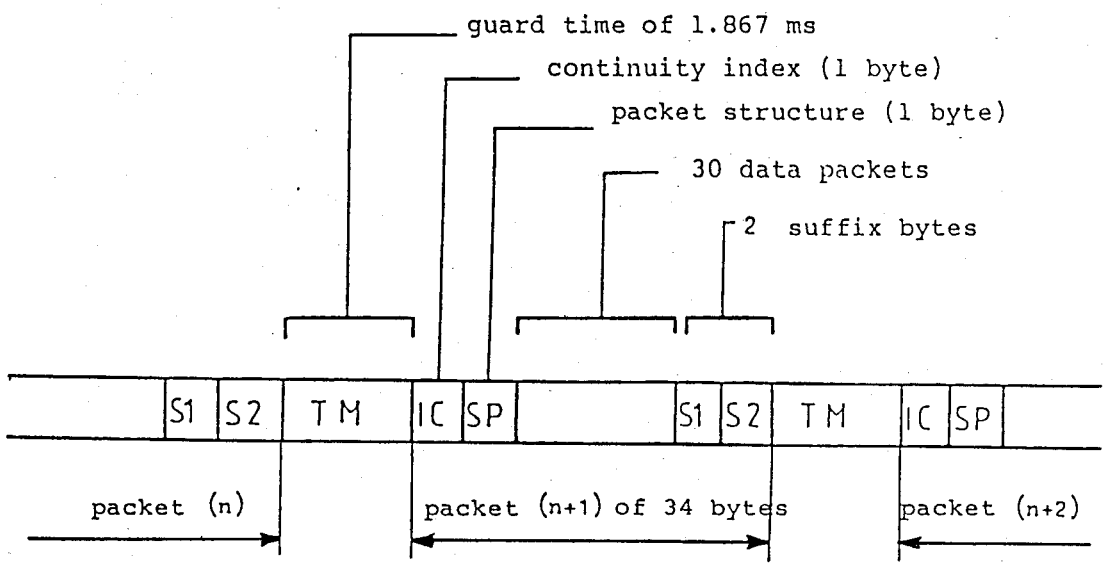
Figure 3:
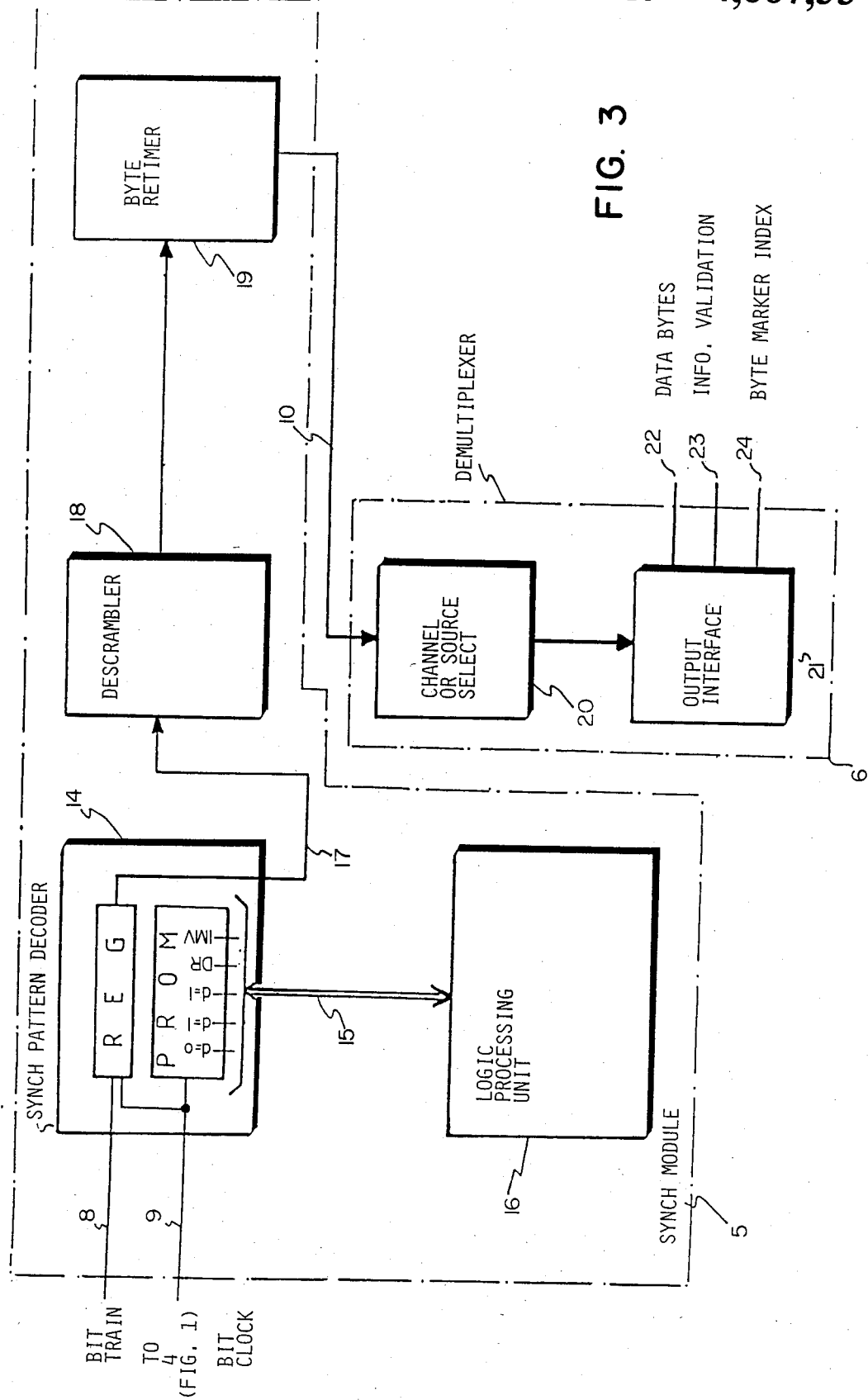
Figure 5:
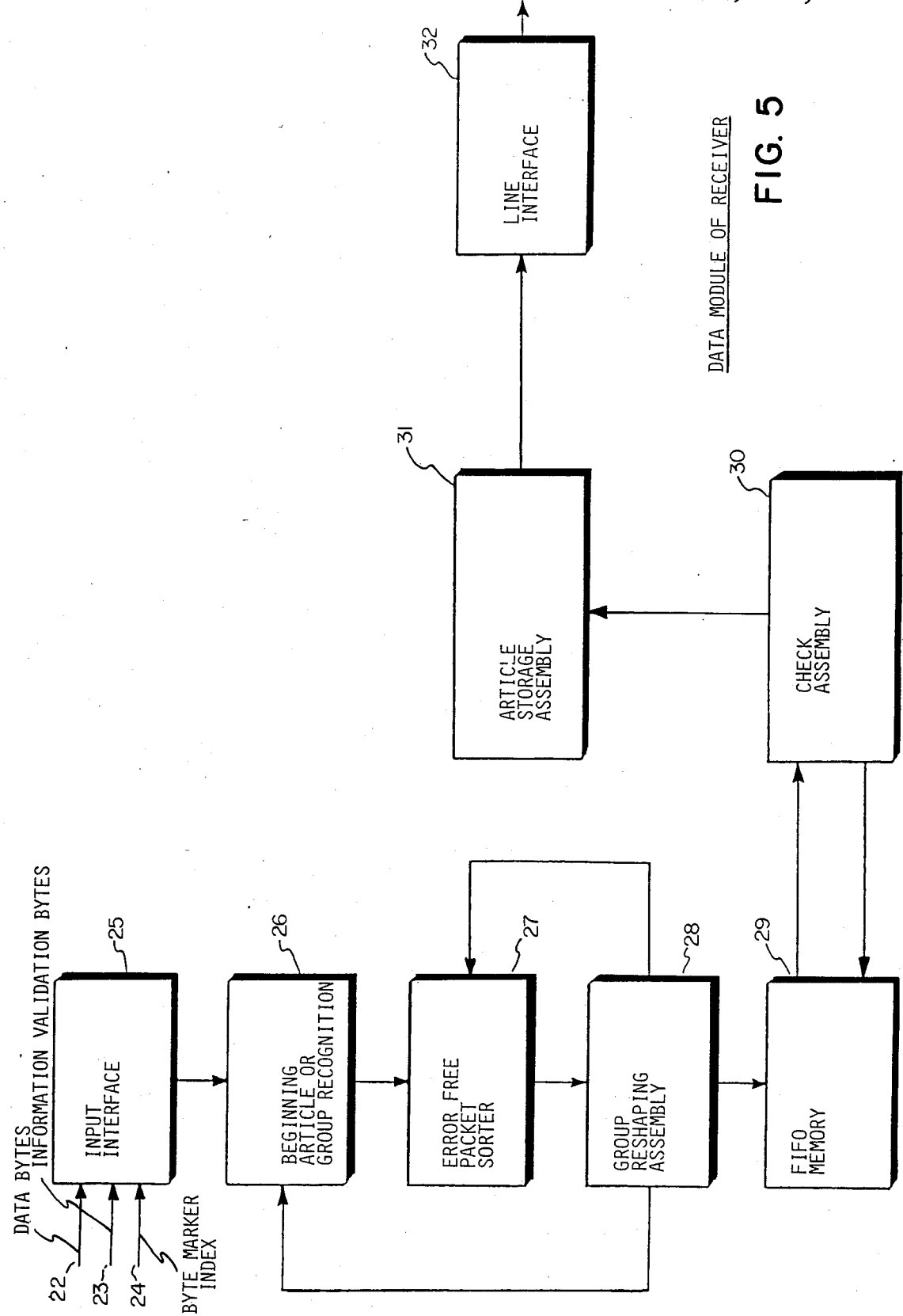
Figure 6:
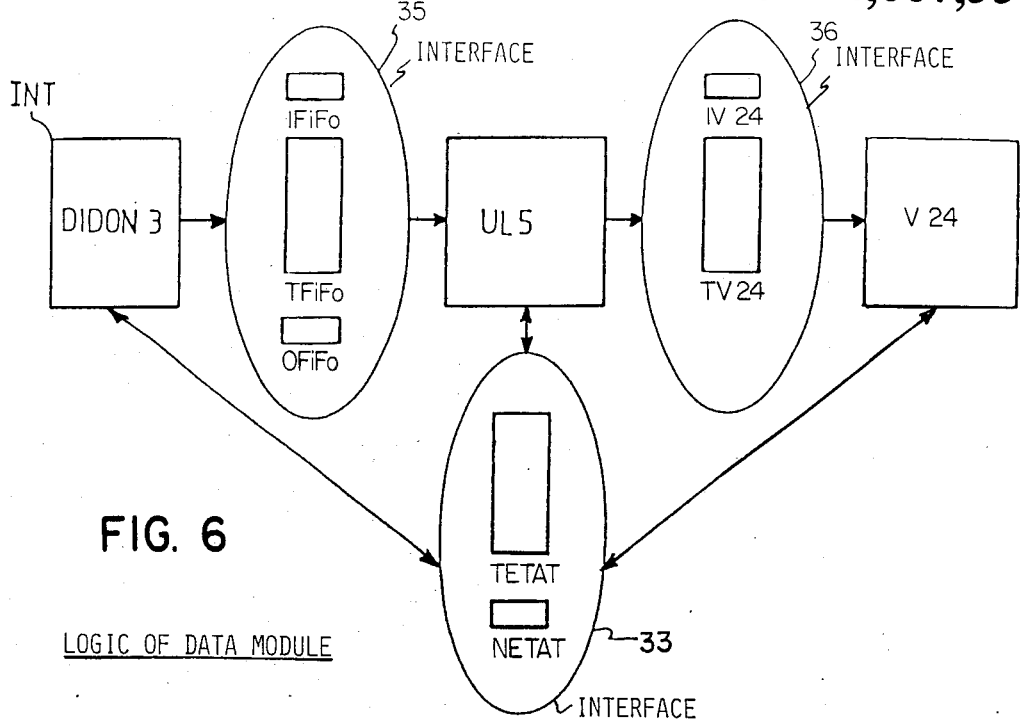
Figure 7:
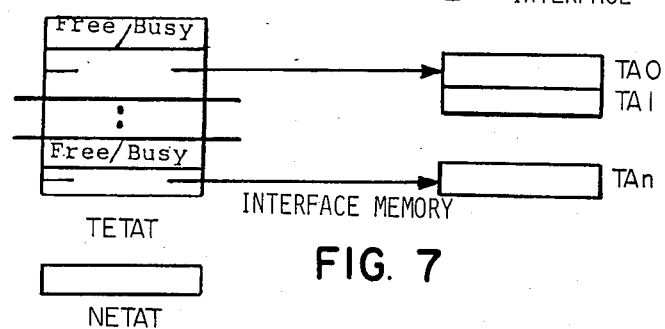
Figure 8:
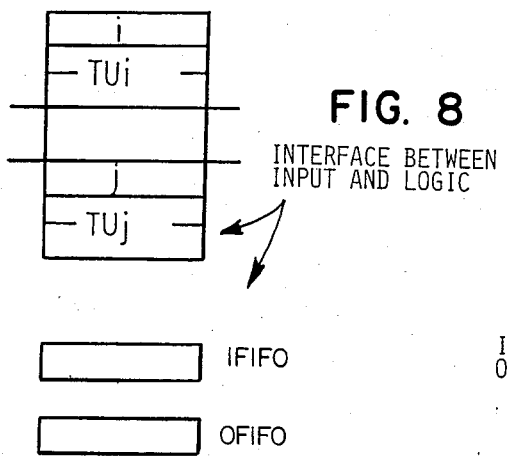
Figure 9:
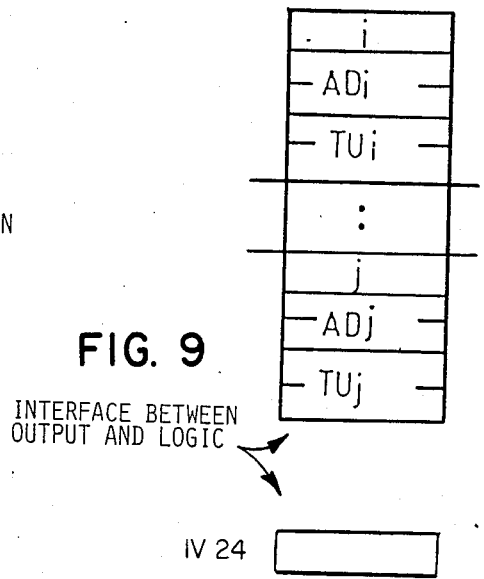
Figure 10:
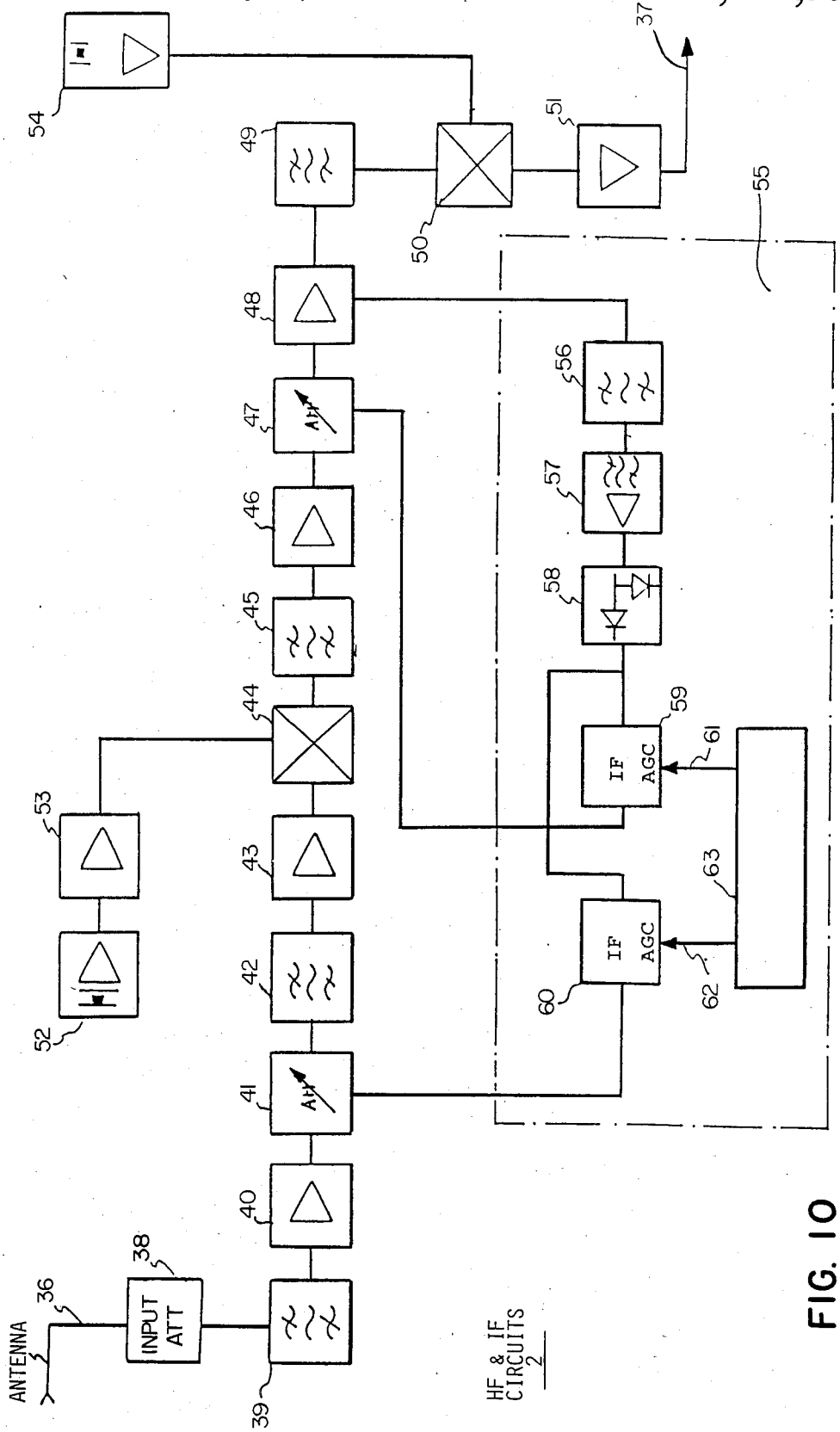
Figure 11:
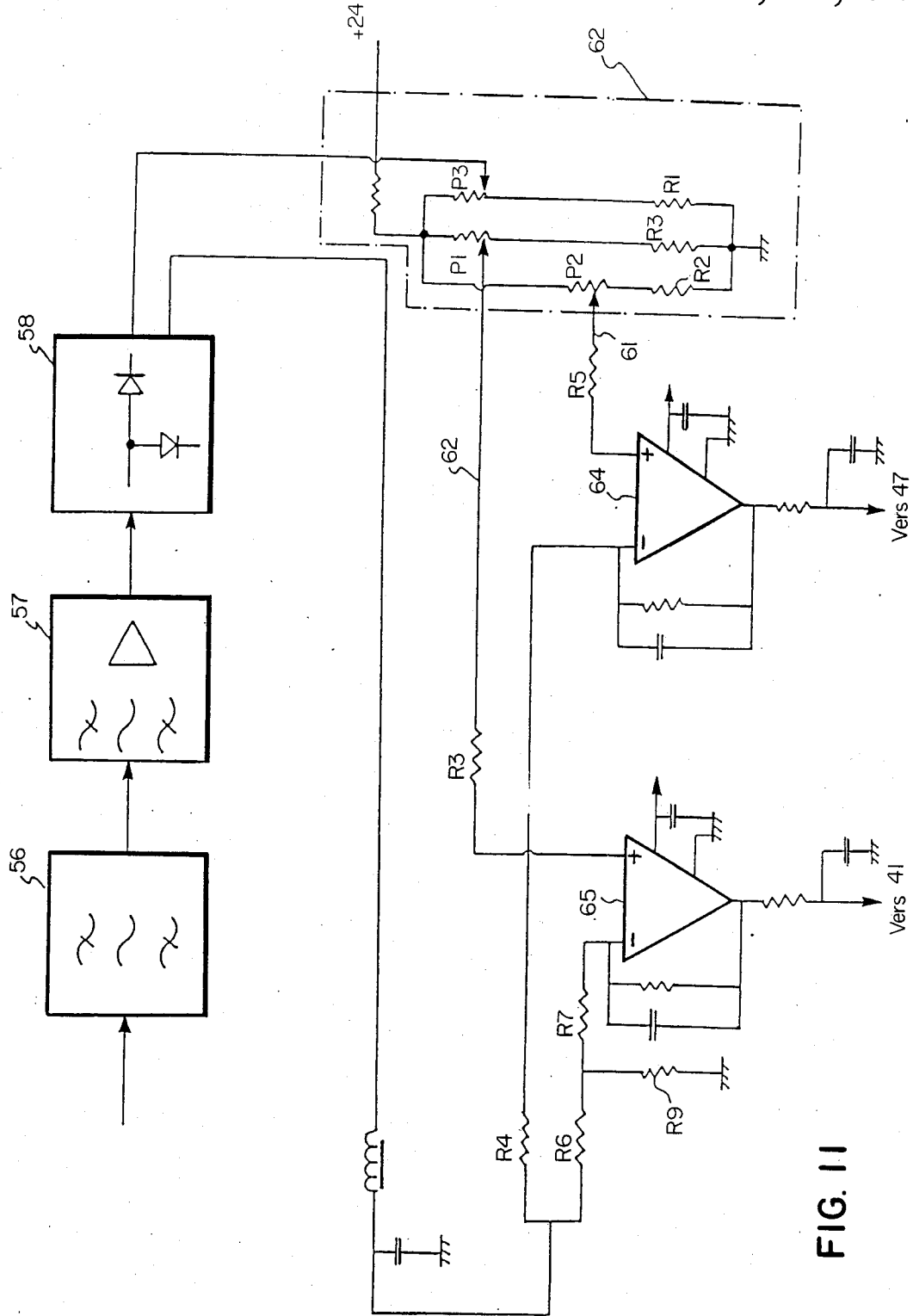
Figure 12:
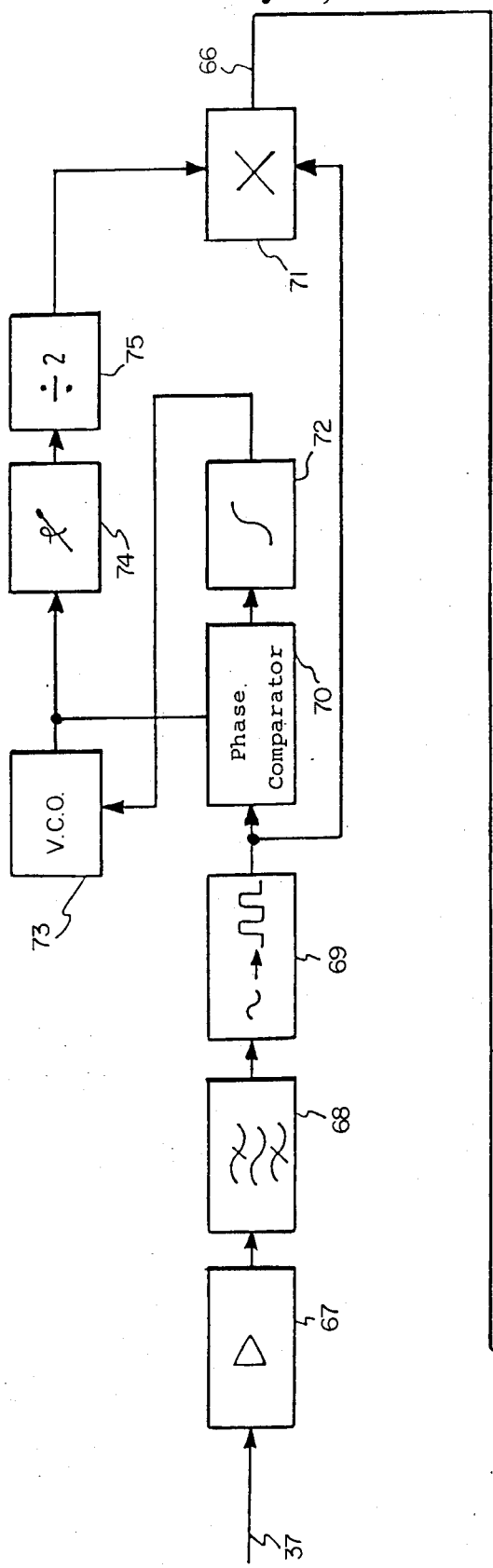
Figure 12:
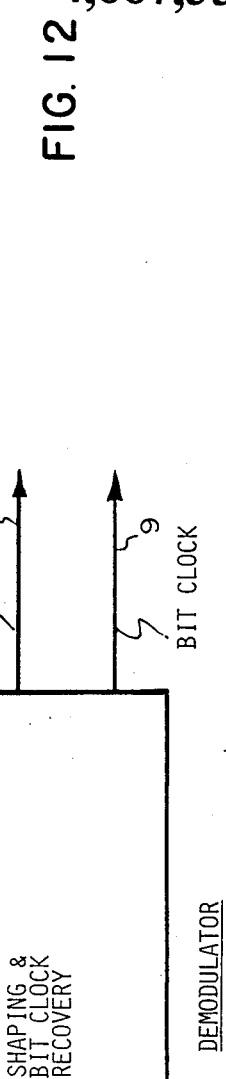
Figure 13:
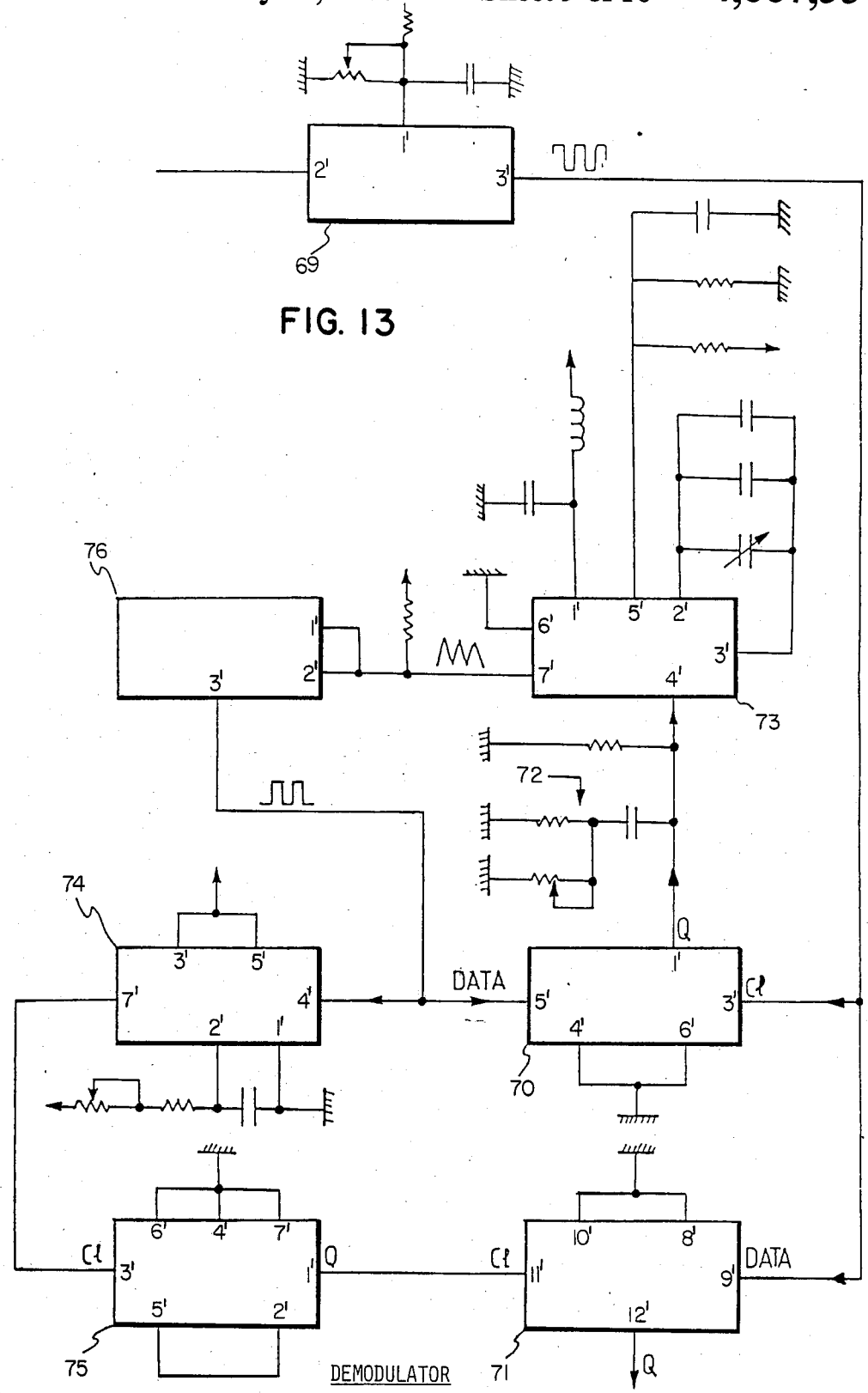

The above mentioned characteristics of the invention, as well as others, will become more apparent upon reading the following description of an embodiment, the said description being carried out in relation to the accompanying drawing, among which:

FIG. 1 is the block diagram of a data receiver in accordance with the invention, FIG. 2a and 2b are schematic diagrams illustrating the binary pulse trains at different points of the receiver shown in FIG. 1, FIG. 3 is a functional block diagram illustrating the operation of the start of packet synchronization module for the receiver shown in FIG. 1, FIG. 4 is a graph illustrating the operation of the synchronization module of FIG. 2, FIG. 5 is the functional block diagram illustrating the operation of the working data module of the receiver shown in FIG. 1, FIG. 6 is a logic schematic illustrating the operation of the working data module of FIG. 5, FIG. 7 is a schematic illustrating the distribution of memory for an interface which is similar for the three software modules of FIG. 6, FIG. 8 is a schematic of an interface between the input module and the principal module of the software of FIG. 6, FIG. 9 is the schematic of an interface between the principal module and the output module of the software of FIG. 6, FIG. 10 is the schematic of the IF and HF portion of the receiver of FIG. 1, FIG. 11 is the schematic of the IF and HF automatic gain control circuits used in the receiver portion of FIG. 10, FIG. 12 is the block diagram of the demodulator for the receiver of FIG. 1, FIG. 13 is the schematic of the demodulator of FIG. 12, and FIGS. 14a and 14b are waveforms illustrating the operation of the domodulator of FIG. 13.

FIG. 1 illustrates the functional structure of a mobile data receiver which is comprised of the following subsystems:

an antenna 1,
a system 2 of IF and HF circuits,
a demodulator 3,
a shaping and bit rate clock recovery circuit 4,
a synchronization module 5,
a demultiplexer 6, and
a data extraction circuit 7.

The system 2 receives the HF signal from the antenna 1 and generates at the input of demodulator 3 an IF signal of practically constant level. The demodulator 3 generates a baseband signal at the input of circuit 4, one output 8 of which generates the binary stream and a second output 9 generates the bit clock of the bit stream of output 9.

The periodic starts of packets are sought in the synchronization circuit 5. The data output 10 which is connected to the input of demultiplexer 6 is only activated in certain good synchronization conditions to be described in more detail below.

The demuliplexer 6 selects the packets corresponding to the source selected in the receiver and transmits to the exploitation circuit 7 the useful bytes of the block by the 8 parallel line link 11, the INT byte validation information through wire 12 and the byte marker index through wire 13.

In the binary stream of FIG. 2a, for which the (n+1) packet is shown preceded by the nth packet and followed by the (n+2) packet, the starts of the "I" packets occur periodically with a periodicity of 41×8 bits. Each packet starts by a packet prefix made up of eight bytes. The packet prefix is followed by a field of data comprising a maximum of 32 bytes, the last two bytes 51 and 52 of the data field forming a suffix or CRC. The data field is followed by up to 41 stuffing bytes between two packet starts "I". Thus, when a data packet has a maximum length of 32 bytes, it is always followed by a 00 stuffing byte.

The prefix comprises two bit suffing bytes R, a byte synchronization byte OC, three channel address bytes X, Y and Z, a packet continuity index IC and a packet structure byte SP. For the given example, when expressed in hexadecimal, the R bytes can be 55 (or AA) and the DC byte can be 18 (or E7).

In the description below, the data field bytes which precede the suffix will be called data blocks, it being understood that the suffix for each packet on that data block is made up of the redundant bits of a calculated 16 degree cyclic code. As in the above mentioned patent application No. EP-A-0 077 712, the data blocks relative to information originating from one source, defined by XYZ, are sequentially arranged in groups of finite length, called data groups. Each group of data is comprised of a group header of data followed by the data of a data group.

The header of the data group follows the prefix of the packet carrying the first block of groups which will be referred to below as the "first packet". The header of the group contains information regarding the group, that is for example:
group type,
group continuity index,
group repetition index,
group size.

In the example described, a group may be repeated between 0 and 15 times.

The synchronization module 5 in FIG. 3 is comprised of a synchronization pattern decoder circuit 14 having one data input connected to the output 8 of the shaping and bit clock recovery circuit 4, FIG. 1, and a clock input connected to the output 9 of the same circuit. It has a channel 15 connected to a processing logic unit 16 and an output 17 connected to the input of an unscrambler or demixing circuit 18 whose output is connected to the input of a data byte rephasing circuit 19. The output of circuit 19 is connected to the input of demultiplexer 6.

The synchronization pattern decoding circuit 14 can be made up of a delay register REG and a read only programmable memory PROM. The capacity of the register is equal to that of the sought after pattern, its data input being connected to input 8 and its clock input being connected to input 9. The serial output of the register is connected by a gate to output 17. The parallel outputs of the register are connected to the address inputs of the PROM which has a number of outputs d=0, d=1, and d+1 which are connected to the link 15. The d=0 output is enabled when the Hamming distance with the synchronization pattern is equal to 0, the d=1 output is enabled when that distance is equal to 1 and the d+1 output is enabled when that distance is larger than 1. Furthermore, the memory has a DIR output indicating that the pattern processed was a direct word and an INV output indicating that the pattern processed was the complement of the direct word. Between these outputs and link 15 are provided a set of gates which are validated through link 15 at predetermined instants by the logic unit 16.

The processing logic unit 16 is comprised of a microprocessor which is capable of analyzing the information generated by the outputs d=0, d=1 and d+1, and to take on the four states E0, E1, E2 and E3 illustrated in FIG. 4. The logic unit 16 decides, in relation to these states, the reading instant of outputs d=0, d=1 and d+1. On the other hand, it has a control output to validat=or not link 17.

The descrambling circuit 18 is a known circuit which is necessary when scrambling was used at transmission in order to faoilitate bit clock recovery. In fact, certain data combinations could suppress the spectral energy at the frequency to be recovered. To avoid this, the packet with the exception of its header is scrambled by a pseudo-random sequence, the pseudo-random sequence being initialized at each packet. The descrambling is carried out in circuit 18 through modulo-2 addition with a table in read only memory.

The data byte phase resetting circuit 19 is a circuit that does or does not invert the binary frame depending on whether the INV or DIR output has been enabled in the PROM of circuit 14.

When in state E2, the decoding circuit does a bit by bit search for the synchronization pattern which is made up by the 16 bit sequence comprising the second bit synchronizing byte R followed by byte OC. Thus, when the logic unit 16 is in state E2, the d=0 output is permanently validated. In practice, when in state E2, two patterns AAE7 or 5518 are sought because, given the interference on the received HF signal, the recovery of phase is only to within 180°.

As soon as the synchronization pattern or its inverse has been found, the d=0 output is activated and this information is transmitted by link 15, to the microprocessor of the logic unit 16 which stores the result and changes to the E3 state. At the next packet, that is at a timing difference of 41 bytes, assuming that the synchronization pattern is once again located, the d=0 output is once again activated and the same signal is transmitted from decoder 14 to logic processing unit 16. The logic unit 16 then proceeds to state E0. In the alternate case it returns to state E2. By considering the Hamming distances, we can say that in state E2 the recognition of an error free synchronization pattern forces the system to pass to the E3 state, while in state E2 another recognition of the pattern with distance d=0 forces the system to go to state E0, while if we have d different from 0, the system returns to state E2.

In state E0, the search for the synchronization pattern is validated at the 25th bit following the start "I" of each packet, that instant being determined by the logic unit 16. If, while in state E0, the next synchronization pattern that is found is at a Hamming distance d=0 or d=1, the corresponding outputs and the logic unit 16 leave the system in state E0.

If, when in state E0, the next synchronization pattern found is at a Hamming distance larger than 1, the d+1 output is activated and the logic unit 16 forces the system to state E1.

While in state E1, if the next synchronization pattern being sought at the 25th bit after instant "I", is found with a Hamming distance d=0 or d=1, the corresponding outputs are activated and the logic unit forces the system to state E0.

If, while in state E1, the next synchronization pattern found has a Hamming distance greater than 1, the d+1 output is enabled and the logic unit 16 forces the system to return to state E2.

The demultiplexer 6 of FIG. 4 comprises a source or channel selection unit 20 whose output is connected to an output interface 21. The selection circuit 20 receives the binary stream from circuit 19 and can be made up, like circuit 14, by a register and a programmable memory whose contents indentifies the XYZ of the source or channel whose data the user wishes to exploit. Considering the X, Y and Z source address bytes are protected by a Hamming code, as is the general case for all header bytes, the selection circuit also comprises the necessary correction circuits installed upstream from the register. When the selection circuit has recognized the X, Y and Z bytes with a Hamming distance d equal to 0 or 1, it transmits to the output interface 21, the bytes that follow the Z byte.

The output interface 21 thus receives the binary stream illustrated in FIG. 2b. Each burst of 34×8 bits is separated from another burst by a guard time, which corresponds to 1.867 ms for a bit rate of 30 kbit/s. The byte serial-to-parallel conversion interface 21 has a port 22 which generates the bits B0 to B7 of each data byte, an output 23 which transmits an interrupt INT request bit and an output 24 which transmits a byte index marker bit IC. Thus, to within one byte, the interface makes an interrupt request INT through 22 towards the exploitation circuit 7. In other respects, the IC bit is marked during the transmission of the index byte. Thus, the exploitation circuit synchronizes itself at the beginning of each packet on IC and in the case processing is interrupted due to errors, on the group header bytes of the first packet. Thus, on one hand, the circuits 5 and 6 and, on the other hand, 7 can operate independently with their own respective performances.

The functional diagram of FIG. 5 illustrates the operation of the exploitation module 7 whose purpose is to yield data pages to the user.

It will be assumed below, that using the DIDON 3 procedure mentioned above to propel a catalog made up of address pages XYZ and segmented into articles (in accordance with the UL5 ANTIOPE norm), that a one to one correspondence exists between an article and a group.

The operational blocks of circuit 7 are an input interface 25 whose inputs are respectively connected to the links 22 to 24 originating from the multiplexer 6. The output of the input interface is connected to a start of group or article seeking subsystem 26 whose output is connected to the input of an error-free packet seeking subsystem 27. The output of block 27 is connected to a subsystem 28 for group reconstitution after the repetitions. The outputs of block 28 are respectively connected to blocks 26 and 27 and to a sequential memory 29 containing the list of articles. The memory 29 is connected to a subsystem 30 that controls the presence of connected articles that make up one page. The output of block 30 is connected to a subsystem 31 containing the list of articles to be supplied to a line interface 32 which delivers the selected page to the user. The line interface 32 is a V24 link defined in accordance with the corresponding CCITT recommendation.

The subsystem 27 processes the suffix of each data block and rejects all packets containing errors. However, it forwards to 28 each good packet found, to be stored at the address defined by the continuity IC index. The output of 28 towards 26 is used to reinitialize 26 to search for a start of group. The output of 28 towards 27 tells this one what value of continuity index it must keep track of.

In the logic schematic of FIG. 6, we have three interfaces 33 to 35 between the DIDON 3 modules UL5 and V24.

The interface 35, which is again shown in FIG. 7, is similar for the three modules and defines the structure of the memory. The article which corresponds to a contiguous portion of memory equal in size to the maximum size of an article which is 2010 bytes for the example described is the unit transmittable between the units.

The data structure describing the distribution of memory in interface 33 is shown in FIG. 7, where:

TAn is the buffer for article number n, with a size of 2010, that is 67 packets of 30 bytes, TETAT is the table describing the memory, with (n+1) three byte elements, where:

one byte indicates if the buffer is free or used by a module, two bytes give the address of the buffer, NETAT is one byte indicating the number of free buffers, with for example, a maximum of 256.

At initialization, all buffers are declared free, except one which is assigned to the DIDON 3 module to receive the first article, and NETAT is initialized to n.

The interface 34 is between the DIDON 3 module and the UL5 module. The subject matter manipulated is also the article. The articles pass through a sequentially organized FIFO memory of size (n+1).

In the interface 34, FIG. 8, the structure comprises the following elements:

TFIFO is a table of (n+1) three byte element, where, one byte i gives the index in TETAT, FIG. 7, of the buffer used, two bytes TUi give the useful space in the buffer, IFIFO is the index in TFIFO indicating where the next complete article is to enter, OFIFO is the index in TFIFO indicating the oldest article arrived.

At initialization, IFIFO and OFIFO are set to 0 to indicate that the first complete article is to be placed at the top of the FIFO and that the FIFO is empty.

The interface 35, FIG. 9, is a table which indicates the portions of memory to be transmitted on the V24 link. Its structure comprises the following elements:

TV24 is an n five byte element table where, one byte i gives in TETAT, FIG. 7, the index of the buffer used, two bytes ADi give the address of the first byte to be transmitted on the V24 link, and two bytes TUi give the exact number of bytes to be transmitted, IV4 is in TV24. is the index that indicates the description of the last buffer to be emptied.

The DIDON 3 module, FIG. 6, is activated under INT at each byte that appears on link 22. For reasons of efficiency, a single recopying of information is provided, thus implying an apriori knowledge of where the byte will be written in the buffer. In practice an article (or group) buffer is fictitiously segmented into blocks of 30 bytes, which corresponds to a maximum of 67 blocks.

For each block, a buffer descriptor is created indicating if it has been received correctly.

The purpose of the DIDON 3 module is to investigate the article buffers in relation to the first block and packet continuity indices, containing the header, and to fill the gaps. In order for continuous receiving capability, a buffer must always be assigned to the DIDON 3 module.

An article is passed along to the sequential memory 34 if and only if this article has been completely received without error and if there remains a free buffer in 34. If one of these conditions is not met after receiving the whole article, the same buffer will be reused, with a descriptor reset to 0, for receiving the next article.

The module UL5 operates alternately with the V24 module to determine if a complete page has been received. The entering articles are taken from OFIFO providing that OFIFO is different from IFIFO. This condition is sufficient because, given the size (n+1) of the sequential memory 34 and the maximum number n of articles being input, the only case where OFIFO=IFIFO occurs when the sequential memory is empty.

The UL5 module is active up to the point where it determines that an entire page has been received. At that point, there is the construction of the TV24 table and continuation to the line discharging module V24.

When a complete page has been received, module V24 is enabled. It is then a case of emptying the IV24 entries from table TV24. Every time that a buffer is emptied, its state in TETAT is reset to free.

The initialization of software to fill TETAT and NETAT and to initialize DIDON 3 is delegated to the UL5 module.

FIG. 10 shows a block diagram of the IF and HF subsystems of the receiver. Arranged in series, between the input 36 connected to the antenna 1, and the output 37 connected to the demodulator, these comprise an input attenuator 38, a bandpass filter 39, an HF amplifier 40, a variable attenuator 41, a bandpass filter 42, another HF amplifier 43, a first mixer 44, a bandpass filter 45, an IF amplifier 46, a second variable attenuator, a second IF amplifier 48, a bandpass filter 49, a second mixer 50 and an IF amplifier 51.

The first mixer 44 has a second input connected to the output of a first local oscillator 52 by an amplifier 53. The second mixer 50 has a second input connected to a second local oscillator 54.

The amplifier 48 has a second output which is connected to the automatic gain control voltage generator circuit 55. The output 48 in circuit 55 is connected to the input of a quartz filter 56 whose output is connected to a tuned amplifier whose output is connected to a peak detection circuit 58. The output of the peak detection circuit 58 is connected, on one hand, to a first voltage generator 59 whose output is connected to the control input of a variable attenuator 48, and, on the other hand, to a second voltage generator 60 whose output is connected to the control input of the voltage attenuator 41. The generators 59 and 60 respectively have adjustable reference voltages 61 and 62 generated by circuit 63. The above described structure of the subsystem 2 of FIG. 10 is totally conventional in nature. At input 36, the HF frequency may be, for example, 67.75 MHz, at the output of the first mixer 44, the first intermediate frequency may be 10.7 MHz, and at the output of the second mixer 50, the second intermediate frequency may be 275 kHz.

In accordance with the invention, the generators 59 and 60 have been designed to take into consideration that the receiver is mobile and is intended to receive digital data.

A detailed schematic diagram of the generators 59 and 60 and of circuit 63 in the automatic gain control circuit 55 is shown in FIG. 11.

The circuit 63 is made up of three voltage dividers, arranged between a +24V source and ground, and comprising respectively a potentiometer P1 in series with a resistance R1, a potentiometer P2 in series with a resistor R2, and a potentiometer P3 in series with a resistor R3. The cursor of potentiometer P1 is connected to the voltage polarity input of peak detector 58 and allows the classical centering of the automatic gain control.

The generator 59 is made up of an operational amplifier 64, such as that commercially available under reference number LF 13741, whose inverting input is connected to the output of peak detector 58 by a resistor R4, whose non-inverting input is connected by a resistor R5 to the cursor of potentiometer P2 and whose output is connected to the control input of IF attenuator 47.

Similarly, the generator 60 is made up of an operational amplifier 65, of the same type as that of 64, whose inverting input is connected to the output of peak detector 58 by two resistors R6 and R7 in series, whose non-inverting input is connected to the cursor of potentiometer P3 by a resistor R8, and whose output is connected to the control input of HF attenuator 41. The common point to resistors R6 and R7 is connected to ground by a resistor R9.

In each of the operation amplifiers 64 and 65, the output is also connected to the inverting input by a resistor in parallel with a capacitor.

It is known that in conventional radio frequency receivers, two automatic gain controls are generally provided, one with a large dynamic range operating at IF while the other operating at HF intervening only when the levels entering the receiver are high, thus protecting it from the risks of intermodulation.

In the case of mobile data reception in "I" band, the vehicle antenna has a gain in the neighborhood of OdB, and the industrial interference is often 15 to 20dB above the useful signal. Thus, in accordance with the invention, the purpose of the automatic gain control is to best protect the amplification stages against the risks of intermodulation due to interferring signals. During data broadcasting, the bit error rate degradation becomes sensitive to E/No less than 12dB. We can thus attenuate the signal right from the first stages without risking a degradation in the receiver's performance.

The settings on the cursors of potentiometers P2 and P3 allow a threshold offset between 64 and 65 thus differentiating the HF AGC from the IF AGC. The setup at the inverting input of amplifier 65 allows a reduction in the time constant of amplifier 65 with respect to that of amplifier 64. In other words, we select for the HF AGC a time constant that is five times less than that of the IF AGC. As a result, when the HF AGC operates, it does so very rapidly.

For slow variations at input 36, the IF and HF AGC balance one another out during operation. During rapid variations, the IF AGC lines itself up on the average value of the signal, with the HF AGC operating on the rapid variations in level which allows an optimal operating point for the input stages, ensuring that best protection against industrial interference.

FIG. 12 illustrates a detailed block diagram of the demodulator 3 which receives at its input 37 the second intermediate frequency signal at 275 kHZ and generates at its output 66 the demodulated signal to the shaping and bit clock recovery circuit 4.

The input 37 is connected to an amplifier 67 whose output is connected to a bandpass filter 68 whose output is connected to a rectangular shaping circuit 69. The output of the rectangular shaping circuit 69 is connected, on one hand, to the first input of a phase comparator 70 and, on the other hand, to a first input of a multiplier 71. The output of the phase comparator 70 is connected to the input of an integrator 72 whose output is connected to the control input of a voltage controlled oscillator VCO 73. The output of VCO 72 is connected, on one hand, to the second input of phase comparator 70 and, on the other hand, to the input of a phase shifter 74 whose output is connected to the input of a divide by two frequency divider 75 whose output is connected to the second input of multiplier 71. The output of multiplier 71 generates the demodulated signal.

The demodulator of FIG. 12 is more specifically designed to recover NRZ coded digital signals from an MSK modulated carrier centered at 272.8 kHz. The coherent demodulation requires the regeneration of the reference signal cos F$_1$t. It is obtained from the VCO oscillator 73 which operates at frequency 2F$_1$. The feedback loop of the VCO oscillator comprises a phase comparator 70 operating at 2F$_1$, thus eliminating the phase information. The actual demodulation of the said modulated signal is carried out by multiplier 71 which receives the shaped signal and the carrier F$_1$ obtained through dividing by two the output of the VCO oscillator. The phase shifter or adjustable delay circuit 74 is used to adjust the phases at the inputs of the multiplier.

It is thus apparent that the demodulator of FIG. 12, unlike classical demodulators, does not introduce analog multipliers which, in the presence of noise, lose part of their efficiency. Furthermore, at the frequencies used for the embodiment using MSK modulation, at a bit rate of 30 kbit/s, conventional technology would be rather cumbersome.

Obviously other modulation than MSK modulation may be used as for instance tamed frequency modulation (TFM) or a similar modulation.

In FIG. 13, we have shown a detailed schematic of the circuits of FIG. 69 to 75 of FIG. 12. The rectangular shaping circuit 69 is put in concrete form by a circuit commercially referred to as a 4093, the VCO oscillator 73 by a 2209 circuit, the phase comparator by a 4013 flip-flop, the variable phase shifting circuit by a 4528 circuit, the divide by two frequency divider circuit by a 4013 flip-flop, and the demodulator by a 4013 flip-flop.

The circuit 69 has its 2* terminal connected to the output of filter 68 and its 3* terminal respectively connected to the C1 and DATA terminals of flip-flops 70 and 71. Terminal 1* of 69 is connected to a circuit that defines its time constant. It generates rectangular MSK signals.

The DATA input of flip-flop 70 is connected to the output of a rectangular shaping circuit 72 whose input is connected to the 7* output. The Q output signals from flip-flop 70 are integrated in an integrator conventionally comprising a capacitor C1 and resistors R10 and R11. The output of integrator 72 is connected to the oscillator's 4* terminal and whose 1*, 2*, 3*, 5* and 6* terminals are connected in a known manner to passive components that determine its center operating frequency.

The circuit 74 has its 4* terminal connected to the 3* terminal of circuit 72, its 1* and 2* terminals connected to a network of passive components, of which a potentiometer allows the setting of its delay, and its 7* terminal connected to the C1 input of divider 75 whose 2* and 5* terminals are connected together, the 4*, 6* and 7* are grounded, and the Q output is connected to the C1 input of demodulator 71. The Q output of 71 generates the demodulated signal.

The operation of comparator 70 is illustrated by the waveforms of FIG. 14a, where the waveform 15a.1 represents the signal with frequency 2F$_1$ applied to the data input DATA of flip-flop 70, FIG. 14a.2 represents the modulating signal applied to the clocking input C1 of 70, and FIG. 14a.3 the Q output signal.

It is apparent that the modulating signal at the clock input allows one to observe at the Q output the state of the DATA input. As shown in FIG. 14a the phase inversion operates, with a constant delay, on only the Q output. The comparator is thus insensitive to 0°–180° phase jumps and takes into consideration only the static phase delays.

The operation of multiplier 71 is illustrated by the waveforms of FIG. 14b, where FIG. 14b.1 represents the signal applied to the C1 clock input of flip-flop 71, FIG. 14b.2 represents the modulating signal applied to its DATA input and FIG. 14b.3 the signal generated by the Q output and which is the demodulated signal.

We claim:
1. A process for radio broadcasting binary data packets that can be received in mobile receivers, in which the starts of packets are transmitted receivers, in which the starts of packets are transmitted periodically, the prefix of each packet starting with two bit synchronizing bytes and a one byte synchronizing byte, the second bit synchronziing byte and the byte sychronizing byte constituting a periodic start of a packet synchronization pattern, said process being characterized in that a synchronization processing step comprises a seeking phase and a tracking phase, transitions from the seeking phase to the tracking phase being effected during the seeking phase when the synchronization pattern has been found two consecutive times with a null Hamming distance, the seeking phase comprising at least two states, the transitions from the first seeking state (E2) to the second seeking (E3) being effected when a synchronization pattern has been found with a null Hamming distance, the transition from the second seeking state (E3) to the first seeking state (E2) being effected when the consecutive pattern is not found with a null Hamming distance, the tracking phase also comprising at least two states, the first tracking state (E0) being the state taken after a transition from the seeking phase to the tracking phase, the transition from the first tracking state (E0) to the second tracking state (E1) being effected when the pattern is found with a Hamming distance greater than 1, the transition from the second tracking state (E1) to the first tracking state (e0) being done when a consectuvie pattern is found to have a Hamming distance which is either null or equal to 1, the transition from the tracking phase to the seeking phase being done during the second phase of the tracking phase when the next pattern is found to have a Hamming distance larger than 1.

2. The process in accordance with claim 1, in which the modulation used is a two state phase modulation with attenuated sidebands, characterized in that, during the seeking phase, the detection of the synchronization pattern is also done on a complement of the synchronization pattern, the seeking and tracking states being paired respectively into direct and complemented states, and in the first seeking state the recognition of the direct pattern inhibits the complemented states and vice versa.

3. The process in accordance with claim 2, in which binary data originating from one source are assembled into groups which are segmented to form a sequence of data blocks, each block being completed by a control suffix constituting the data field of a packet, the transmission of each group being repeated a certain number of times, characterized in that the groups are reconstructed at the receiver, after each group repetition, and such that the groups are assembled into a page of data after each complete error-free group has been received.

4. The process in accordance with claim 2, in which upon a receipt of said data packets they are sent through a first HF stage autOmatic gain control and a second IF stage automatic gain control, characterized in that ·a time constant of the first automatic gain control is slightly shorter than a time constant of the second automatic gain control.

5. The process in accordance with claim 2, in which the binary data are transmitted by using MSK modulation characterized in that at the receiver, the modulated data signals are shaped into rectangular pulse form, then phase compared with a rectangular reference signal having a variable frequency which is twice the carrier frequency of the modulated signal, the phase difference detected at the comparison adjusting the reference signal frequency, and having the frequency of the reference signal in order to provide a signal which is multiplied with the modulated signal to generate the demodulated signal.

6. The process in accordance with claim 1, in which binary data originating from one source are assembled into groups which are segmented to form a sequence of data blocks, each block being completed by a control suffix constituting the data field of a packet, the transmission of each group being repeated a certain number of times, characterized in that the groups are reconstructed at the receiver, after each group repetition, and such that the groups are assembled into a page of data after each complete errro-free group has been received.

7. The process in accordance with claim 6, in which upon a receipt of said data packets they are sent through a first HF stage automatic gain control and a second IF stage automatic gain control, characterized in that a time constant of the first automatic gain control is slightly shorter than a time constant of the second automatic gain control.

8. The process in accordance with claim 6, in which the binary data are transmitted by using MSK modulation characterized in that at the receiver, the modulated data signals are shaped into rectangular pulse form, then phase compared with a rectangular reference signal having a variable frequency which is twice the carrier frequency of the modulated signal, the phase difference detected at the comparison adjusting the reference signal frequency, and having the frequency of the reference signal in order to provide a signal·which is multiplied with the modulated signal to generate the demodulated signal.

9. The process in accordance with claim 1, in which upon a receipt of said data packets they are sent through a first HF stage automatic gain control and a second IF stage automatic gain control, characterized in that a time constant of the first automatic gain control is slightly shorter than a time constant of the second automatic gain control.

10. The process in accordance with claim 9, in which the binary data are transmitted by using MSK modulation characterized in that at the receiver, the modulated data signals are shaped into rectangular pulse form, then phase compared with a rectangular reference signal having a variable frequency which is twice the carrier frequency of the modulated signal, the phase difference detected at the comparison adjusting the reference signal frequency, and having the frequency of the reference signal in order to provide a signal which is multiplied with the modulated signal to generate the demodulated signal.

11. The process in accordance with claim 1, in which the binary data are transmitted by using MSK modulation characterized in that at the receiver, the modulated data signals are shaped into rectangular pulse form, the phase compared with a rectangular reference signal having a variable frequency which is twice the carrier frequency of the modulated signal, the phase difference detected at the comparison adjusting the reference signal frequency, and having the frequency of the reference signal in order to provide a signal which is multiplied with the modulated signal to generate the demodulated signal.

12. A radio broadcasting system for binary data packets that can be received by mobile receivers, in which the starts of packets are transmitted periodically, the prefix of each packet starting with two bit synchronization bytes and a one byte synchronization byte, the second byte of bit synchronization and the byte synchronization byte constituting a periodic start of a packet pattern, said system comprising means for synchronizing said packets by a process using a seeking phase and a tracking phase, detecting means for finding a synchronization pattern and a Hamming distance thereof, means responsive to said detecting means for casuing a transition from the seeking phase to the tracking phase during the seeking phase when the synchronization pattern has been found two consecutive times with a null Hamming distance, the seeking phase comprising at least two states, means responsive to said detecting means for causing the transition from a first seeking state (E2) to a second seeking state (E3) when a synchronization pattern has been found with a null Hamming distance, and for causing the transition from the second seeking state (E3) to the first seeking state (E2) when the synchronization pattern is not found with a null Hamming distance, the tracking phase also comprising at least two states, means responsive to said detecting means for causing a first tracking state (E0) after a transition from the seeking phase to the tracking phase, the transition from the first tracking state (E0) to a second tracking state (E1) being done when the next pattern is found with a Hamming distance larger than 1, the transition from the second tracking state (E1) to the first tracking state (E0) being done when the next pattern is found with a null or equal to 1 Hamming distance, the transition from the tracking phase to the seeking phase being done during the second state of the tracking phase when the next pattern is found with a Hamming distance larger than 1.

13. A system in accordance with claim 12, and modulator means in which a modulation which is used is an attenuated sideband with a two state phase modulation, is characterized in that, during the seeking phase, the synchronization pattern detection is also carried out on a complement of the synchronization pattern, the seeking and tracking states being respectively paired into direct and complemented states, and means in the first seeking state responsive to a recognition of a direct pattern for inhibiting the complemented states and vice versa.

14. A system in accordance with claim 13, in which the binary data originating from one source are arranged in groups.

15. A system in accordance with claim 12, in which the binary data originating from one source are arranged in groups.

* * * * *